(12) United States Patent
Kwan et al.

(10) Patent No.: US 7,549,569 B2
(45) Date of Patent: Jun. 23, 2009

(54) WIRE CLAMP GAP CONTROL MECHANISM AND METHOD

(75) Inventors: Ka Shing Kenny Kwan, Singapore (SG); Chong Hao Chen, Singapore (SG); Gang Ou, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 372 days.

(21) Appl. No.: 11/479,774

(22) Filed: Jun. 29, 2006

(65) Prior Publication Data

US 2008/0000946 A1 Jan. 3, 2008

(51) Int. Cl.
*B23K 5/22* (2006.01)
*B23K 1/06* (2006.01)
*B25B 1/06* (2006.01)

(52) U.S. Cl. ............... 228/212; 228/110.1; 228/904; 269/254 CS

(58) Field of Classification Search ... 228/110.1–111.5, 228/180.5, 1.1, 904, 212, 213, 44.3, 47.1; 156/64, 73.1–73.4, 73.6, 358, 580.1; 269/32, 269/24, 27, 95, 254 CS, 6, 3
See application file for complete search history.

(56) References Cited

U.S. PATENT DOCUMENTS

| | | | | |
|---|---|---|---|---|
| 3,430,834 A | * | 3/1969 | Mansour et al. | 228/1.1 |
| 3,672,556 A | * | 6/1972 | Diepeveen | 228/49.5 |
| 4,653,681 A | * | 3/1987 | Dreibelbis et al. | 228/4.5 |
| 4,903,883 A | * | 2/1990 | Thurlemann et al. | 228/1.1 |
| 5,314,175 A | * | 5/1994 | Izumi et al. | 269/224 |
| 5,901,896 A | * | 5/1999 | Gal | 228/4.5 |
| 6,439,448 B1 | * | 8/2002 | Ringler | 228/110.1 |
| 6,513,696 B1 | * | 2/2003 | Ho et al. | 228/4.5 |
| 6,783,052 B2 | * | 8/2004 | Liao et al. | 228/4.5 |
| 6,899,262 B2 | * | 5/2005 | Gaunekar et al. | 228/44.3 |
| 6,902,101 B2 | * | 6/2005 | Horie et al. | 228/180.5 |
| 6,948,387 B2 | | 9/2005 | Chen et al. | 73/862.541 |
| 2006/0144905 A1 | * | 7/2006 | Oblak et al. | 228/110.1 |
| 2008/0302857 A1 | * | 12/2008 | Felber | 228/47.1 |

FOREIGN PATENT DOCUMENTS

JP 6-244234 9/1994

* cited by examiner

*Primary Examiner*—Jessica L Ward
*Assistant Examiner*—Carlos Gamino
(74) *Attorney, Agent, or Firm*—Ostrolenk, Faber, Gerb & Soffen, LLP

(57) ABSTRACT

An apparatus and method for automatically controlling a clamp gap between clamping arms of a wire clamp is provided wherein a motor generates an actuation force for moving the clamping arms relative to each other. A resilient member is positioned such that the actuation force acts upon and flexes the resilient member to an extent that is proportional to the clamp gap, and the clamp gap is controlled by adjusting the amount of actuation force according to a predetermined relationship between the actuation force and the clamp gap.

9 Claims, 7 Drawing Sheets

WIRE CLAMP GAP CONTROL MECHANISM AND METHOD

FIELD OF THE INVENTION

The invention relates to wire bonders and in particular to the feeding of wire to bonding positions during wire bonding.

BACKGROUND AND PRIOR ART

Wire bonders are used in semiconductor assembly and packaging to make electrical connections between bond pads of electronic components. During wire-bonding of semiconductor devices, it is common to utilize a wire clamp to feed wire from a roll of bonding wire towards a bonding site, and to control and manipulate the wire. The wire is fed to a bonding tool, such as a tip of a capillary attached to a horn. An ultrasonic transducer is in turn coupled to the horn for generating ultrasonic bonding energy to bond the wire at the tip of the capillary.

The wire clamp is opened to allow wire to feed through during threading of the wire through a capillary and thereafter is closed to grip and control the wire. The wire clamp is also used to hold the wire in position during the making of first and second bonds on the electronic components. The clamp is further commonly used to enable looping of a length of bonding wire between electrical contact points on the electronic components, and/or to pull wires from bonds after the bonds have been made.

The wire clamp typically comprises a movable arm or member, and a fixed arm or member. The movable arm is opened and closed by a solenoid or a linear motor, and is usually urged towards the fixed arm by a spring or the motor. The bonding wire is very fine, often to the order of 1 mil or less. Thus the wire is easily broken if it is subjected to excessive force. It is important that a gap between the movable and fixed arms is sufficient for the wire to pass through, and yet not be so large as compared to the size of the wire when opened so that the clamping force cannot be easily or reliably controlled.

FIG. 1 is a plan view of a wire clamp 100 of the prior art. The wire clamp 100 generally comprises a fixed clamping arm 102 and a movable clamping arm 104. The movable clamping arm 104 is movable relative to the fixed clamping arm 102 about a pivot 106. A wire clamp motor, such as a linear motor 108, is used to drive the movement of the movable clamping arm 104. An opening stopper 110 is located at an extreme position of the movable clamping arm 104 to limit the opening motion of the movable clamping arm 104 and to define a clamp gap 112.

The clamp gap 112 located at the tips of the fixed and movable clamping arms 102, 104 for receiving bonding wire. To control the size of the clamp gap 112, the opening stopper 110 is adjustable to fix the maximum opening position of the movable clamping arm 104. A problem with this design is that the movable clamping arm 104 is configured to hit the opening stopper 110 when opening the wire clamp 100 in order to limit further movement of the movable clamping arm 104. Thus, an impact force is experienced by the wire clamp structure that excites the structure and causes structural vibration. Such unwanted vibration may affect clamping accuracy, and result in greater wear and tear of the apparatus.

Moreover, since the diameter of modern-day bonding wires is generally small, it is difficult to manually adjust the position of the opening stopper 110 to control the size of the clamp gap 112. Therefore, a jig has to be used to set the clamp gap 112, using apparatus such as that described in U.S. Pat. No. 6,948,387 entitled "Clamp Calibration Apparatus and Method". This is time-consuming and has to be done every time the clamp gap needs to be changed for different wire diameters.

An example of another prior art method to control the clamp gap is disclosed in Japanese patent publication number JP 6-244234 entitled "Wire Bonder". It uses a first spring member to control the closed position of a movable arm and a second spring member to control the open position of the movable arm. When the movable arm is in the open position, a motor force for actuating the movable arm is less than a preload force of the second spring member resisting the opening of the movable arm, so that a maximum opening position is defined. To close the movable clamper, the motor force is increased to overcome the preload force so that the second spring member is flexed. In this way, the disclosure seeks to minimize the clamp gap and also the impact force to avoid damage to the wire during wire bonding. Nonetheless, it still uses stopper in the form of a screw (item 32 in Drawing 2 therein) to limit the open position of the movable clamper. The position of the screw stopper will still have to be manually adjusted to fix the clamp gap size. The design of the wire clamp is also more complex and requires more parts, which may reduce reliability.

SUMMARY OF THE INVENTION

It is therefore an object of the invention to seek to provide an improved mechanism for controlling a clamp gap of a wire clamp that avoids some of the aforesaid disadvantages of the prior art that use fixed stoppers to limit clamp gaps.

According to a first aspect of the invention, there is provided a method for controlling a clamp gap between clamping arms of a wire clamp, comprising the steps of: providing a motor to generate an actuation force for moving the clamping arms relative to each other; positioning a resilient member such that the actuation force acts upon and flexes the resilient member to an extent that is proportional to the clamp gap; and controlling the clamp gap by adjusting the amount of actuation force according to a predetermined relationship between the actuation force and the clamp gap.

According to a second aspect of the invention, there is provided an apparatus for controlling a clamp gap between clamping arms of a wire clamp, comprising: a motor for providing an actuation force to move the clamping arms relative to each other; a resilient member positioned such that the actuation force is operative to flex it to an extent that is proportional to the clamp gap; and a control mechanism operative to adjust the actuation force to flex the resilient member according to a predetermined relationship between the actuation force and the size of the clamp gap, whereby to obtain a desired clamp gap.

According to a third aspect of the invention, there is provided an apparatus for controlling a clamp gap between clamping arms of a wire clamp, comprising: a motor for providing an actuation force to move the clamping arms relative to each other; and a resilient member positioned such that the actuation force is operative to flex it to an extent that is proportional to the clamp gap; wherein a maximum clamp gap during operation is defined by a predetermined maximum extent to which the resilient member is configured to flex.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

BRIEF DESCRIPTION OF THE DRAWINGS

Examples of preferred embodiments of wire clamp control mechanisms in accordance with the invention will now be described with reference to the accompanying drawings, in which.

DETAILED DESCRIPTION OF THE PREFERRED EMBODIMENTS OF THE INVENTION

Figure 1:
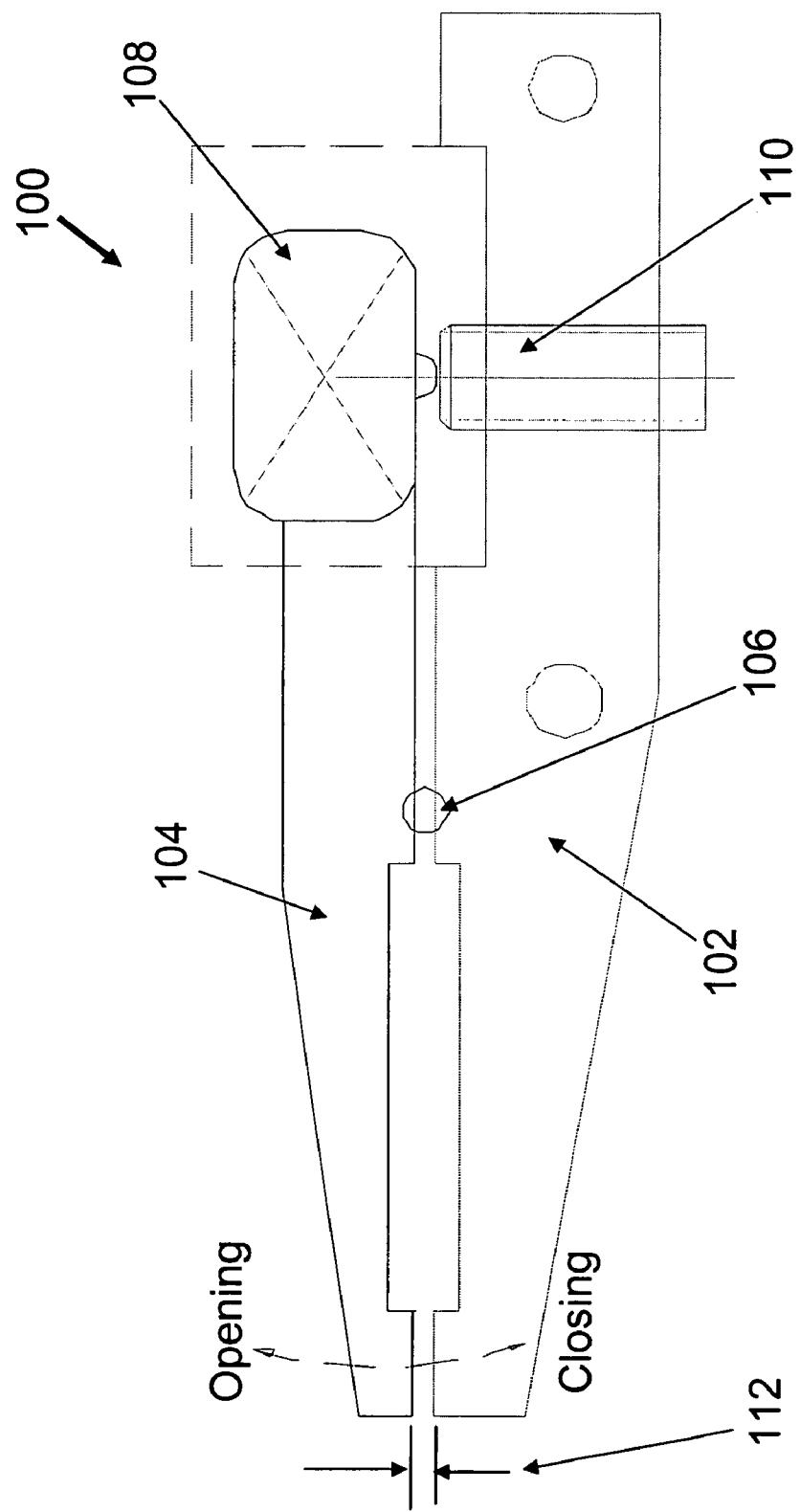
FIG. 1 is a plan view of a prior art wire clamp.
Figure 2:
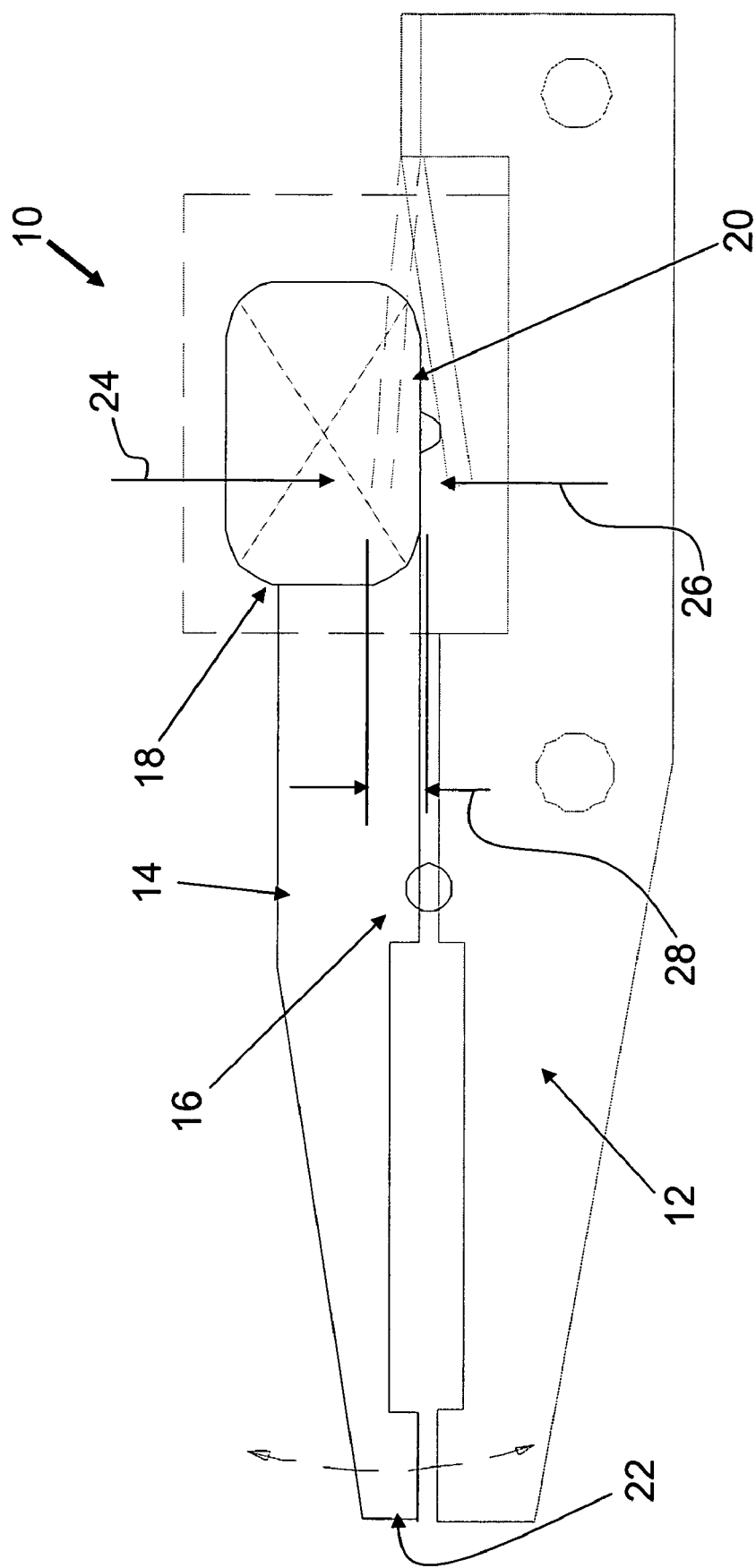
FIG. 2 is a plan view of a wire clamp according to a first preferred embodiment of the invention.

FIG. 2 is a plan view of a wire clamp 10 according to a first preferred embodiment of the invention. The wire clamp 10 comprises a fixed clamping arm 12 and a movable clamping arm 14 that is movably mounted with respect to the fixed clamping arm 12 about a pivot 16. A wire clamp motor, such as a linear motor 18, is used to generate an actuation force to move the clamping arms 12, 14 relative to each other, and in this particular instance, to drive movement of the movable clamping arm 14 with respect to the fixed clamping arm 12 in a first direction, i.e., to open the wire clamp, and in a second direction, i.e., to close the wire clamp.

Instead of a fixed stopper as in the prior art, a resilient member such as a leaf spring 20 is positioned to provide a preload force on the movable clamping arm 14 along its range of motion. Thus, the leaf spring 20 does not stop motion of the movable clamping arm 14 at any fixed position, and it avoids sudden impact of the clamp opening force on the wire clamp structure during opening of the wire clamp 10. In fact, the leaf spring 20 is positioned such that the actuation force acts upon and flexes the leaf spring 20.

It would be appreciated that the clamp gap 22 is proportional to the extent moved by the resilient member in the form of the leaf spring 20 when it is flexed. During actuation of the linear motor 18 to open the wire clamp 10, an actuating motor force 24 is applied onto the movable clamping arm 14. The leaf spring 20 exerts an elastic spring force 26 on the movable clamping arm 14 in an opposite direction to the motor force 24. In order to maintain a position of the movable clamping arm 14 so as to obtain a desired clamp gap 22, the motor force 24 is balanced with the spring force 26, such that the spring force 26 is equal and opposite to the motor force 24. In turn, a spring flex distance 28 moved by the leaf spring 20 is related to the clamp gap 22 produced at the tip of the movable clamping arm 14.

By knowing the physical characteristics of the leaf spring 20 when a flexion force is exerted, a predetermined relationship between the motor force 24 and the clamp gap 22 can be established. The clamp gap 22 is controllable by obtaining the corresponding elastic spring force 26 for a desired clamp gap 22, which is in turn obtainable by adjusting the amount of motor force 24 in accordance with the predetermined relationship, which will be illustrated below in relation to FIGS. 5-7.

Figure 3:
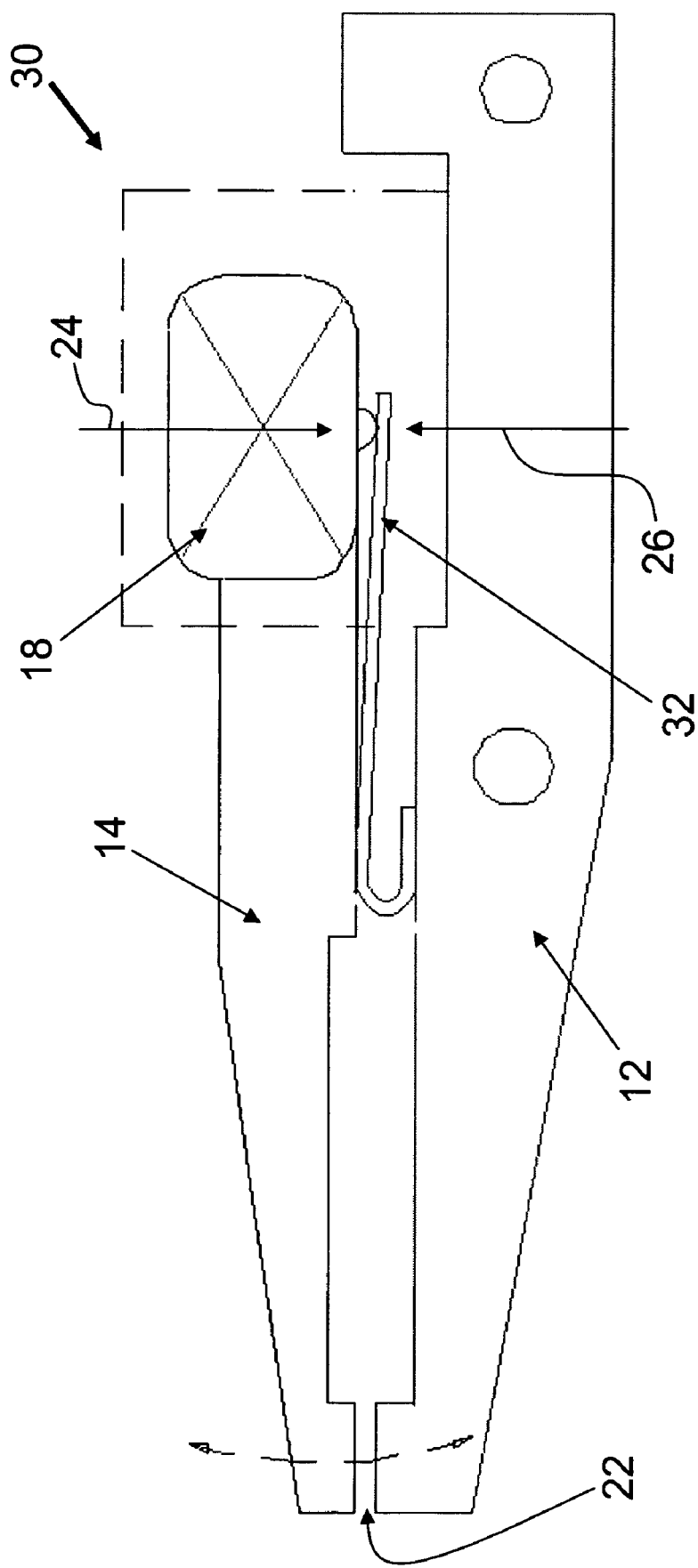
FIG. 3 is a plan view of a wire clamp according to a second preferred embodiment of the invention.

FIG. 3 is a plan view of a wire clamp 30 according to a second preferred embodiment of the invention. In this embodiment, a resilient member in the form of a bent leaf spring with pivot 32 is used to guide pivotal movement of the movable clamping arm 14 relative to the fixed clamping arm 12.

The actuation of the linear motor 18 to open the movable clamping arm 14 creates a motor force 24 which flexes the leaf spring with pivot 32. This will result in an additional reactionary spring force 26 generated in the opposite direction. The distance by which the leaf spring with pivot 32 flexes is proportional to the clamp gap 22. The spring force 26 can thus be related to the clamp gap 22, which is controllable by adjusting the motor force 24.

Figure 4:
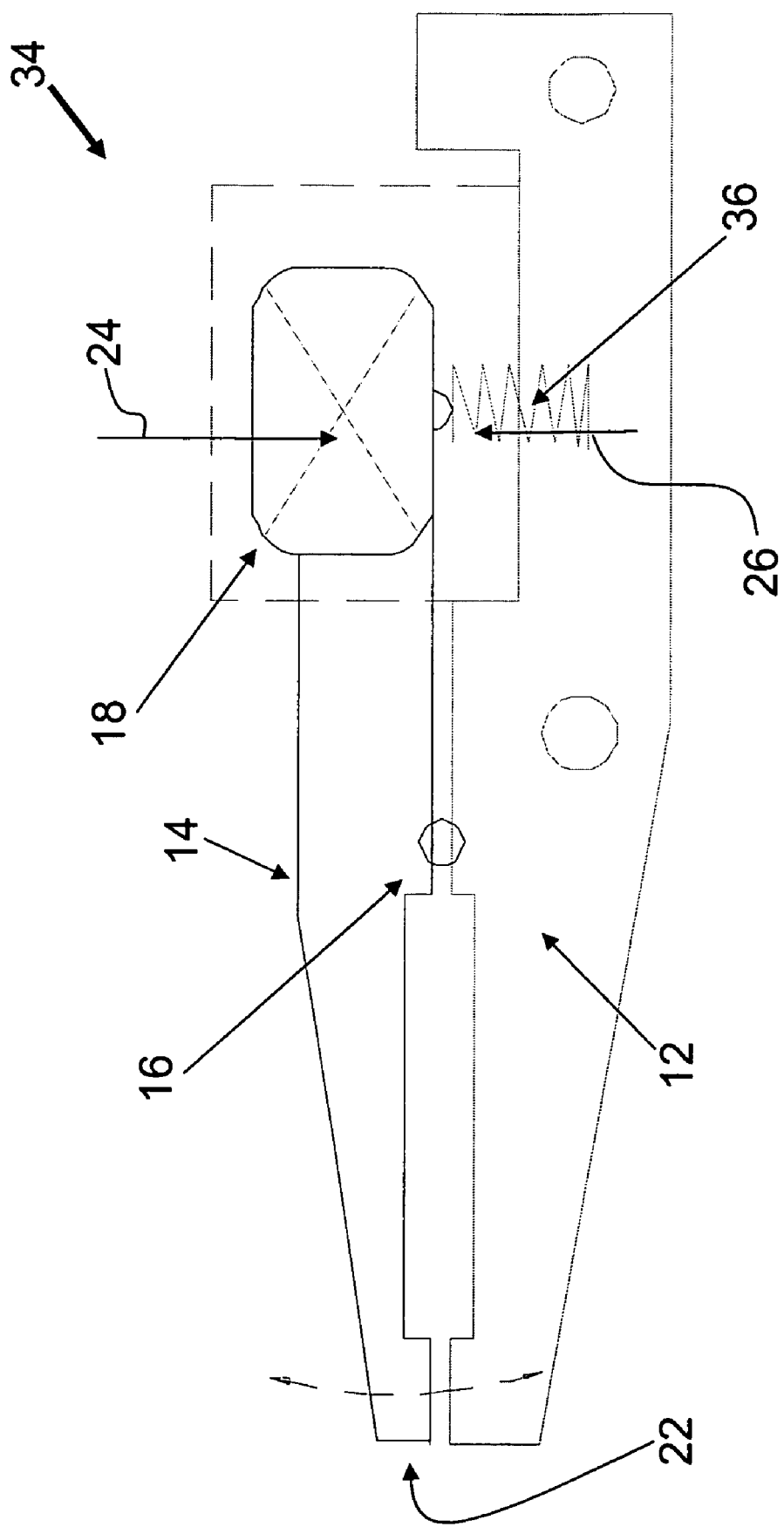
FIG. 4 is a plan view of a wire clamp according to a third preferred embodiment of the invention.

FIG. 4 is a plan view of a wire clamp 34 according to a third preferred embodiment of the invention. Here, the movable clamping arm 14 is movable with respect to the fixed clamping arm 12 about a pivot 16. A compression spring 36 is mounted onto the fixed clamping arm 12. The compression spring 36 is positioned such as to provide a pre-load force onto the linear motor 24 along a range of motion of the movable clamping arm 14.

When the linear motor 18 is actuated to open the movable clamping arm 14 of the wire clamp 34, a motor force 24 is exerted onto the compression spring 36. Accordingly, a spring force 26 is created in the compression spring 36 that acts on the movable clamping arm 14 in an opposite direction. By controlling the motor force 24, the clamp gap 22 can be controlled.

Figure 5:
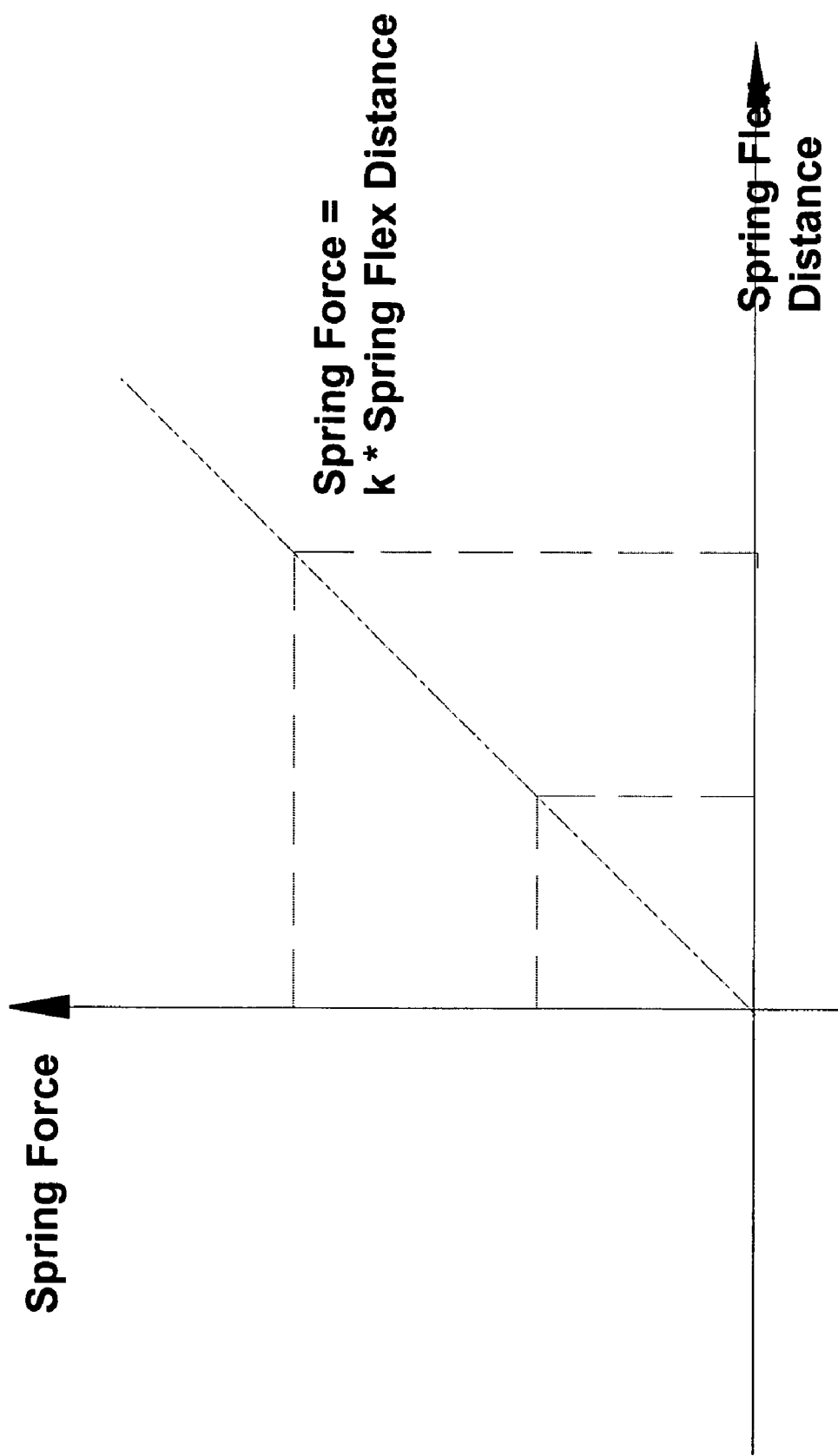
FIG. 5 is a graph showing a linear relationship between spring force and spring flex distance for the purpose of calibrating a wire clamp according to the invention.

FIG. 5 is a graph showing a linear relationship between spring force 26 and spring flex distance 28 for the purpose of calibrating a wire clamp 10 according to the invention. According to Hooke's law of elasticity, the spring force is related to the spring flex distance by the formula: Spring Force=k*Spring Flex Distance, where k is the force constant of a resilient spring member such as a leaf spring 20.

Since the relationship is linear, a distance by which the spring flexes is determinable from the spring force once the force constant is established. Moreover, since the spring flex distance 28 is proportional to the clamp gap 22, and the spring force 26 that is exerted is equal and opposite to the motor force 24, the motor force 24 can be directly related to the clamp gap 22. Therefore, the motor force 24 can be used to control the clamp gap 22. The relationship between the motor force 24 and the clamp gap 22 can be determined through calibration.

Figure 6:
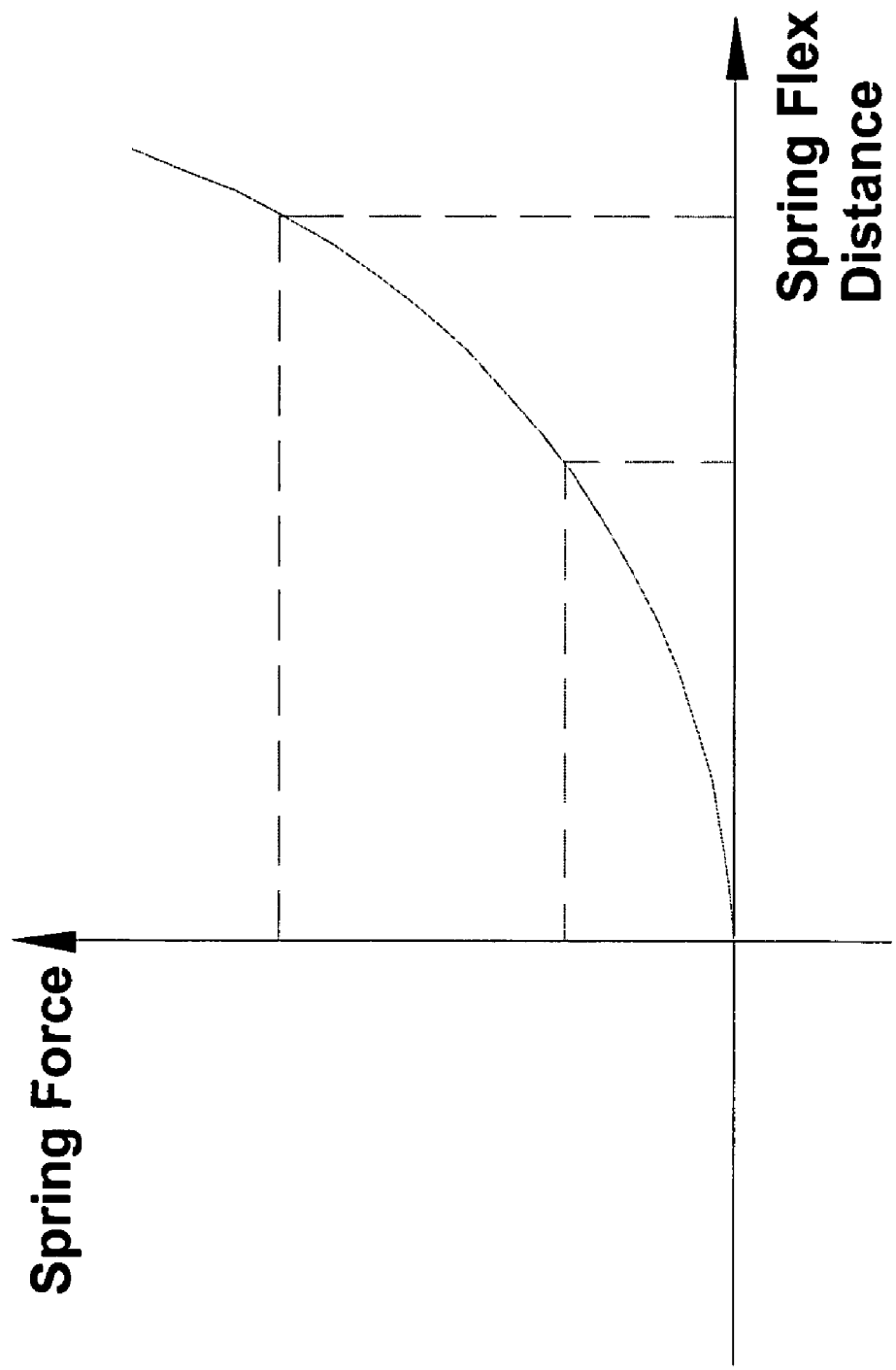
FIG. 6 is a graph showing a non-linear relationship between spring force and spring flex distance for the purpose of calibrating a wire clamp according to the invention.

FIG. 6 is a graph showing a non-linear relationship between spring force 26 and spring flex distance 28 for the purpose of calibrating a wire clamp 10 according to the invention. In this case, the relationship between the spring force and the spring flex distance can be represented in simple terms by the formula: Spring Force=f (Spring Flex Distance).

In the same way as described above, the spring flex distance 28 is proportional to the clamp gap 22, and the spring force 26 is equal to the motor force 24, such that the non-linear relationship between the motor force 24 and the clamp gap 22 can be determined through calibration. Once the relationship is determined, the motor force 24 can be used to control the clamp gap 22.

Figure 7:
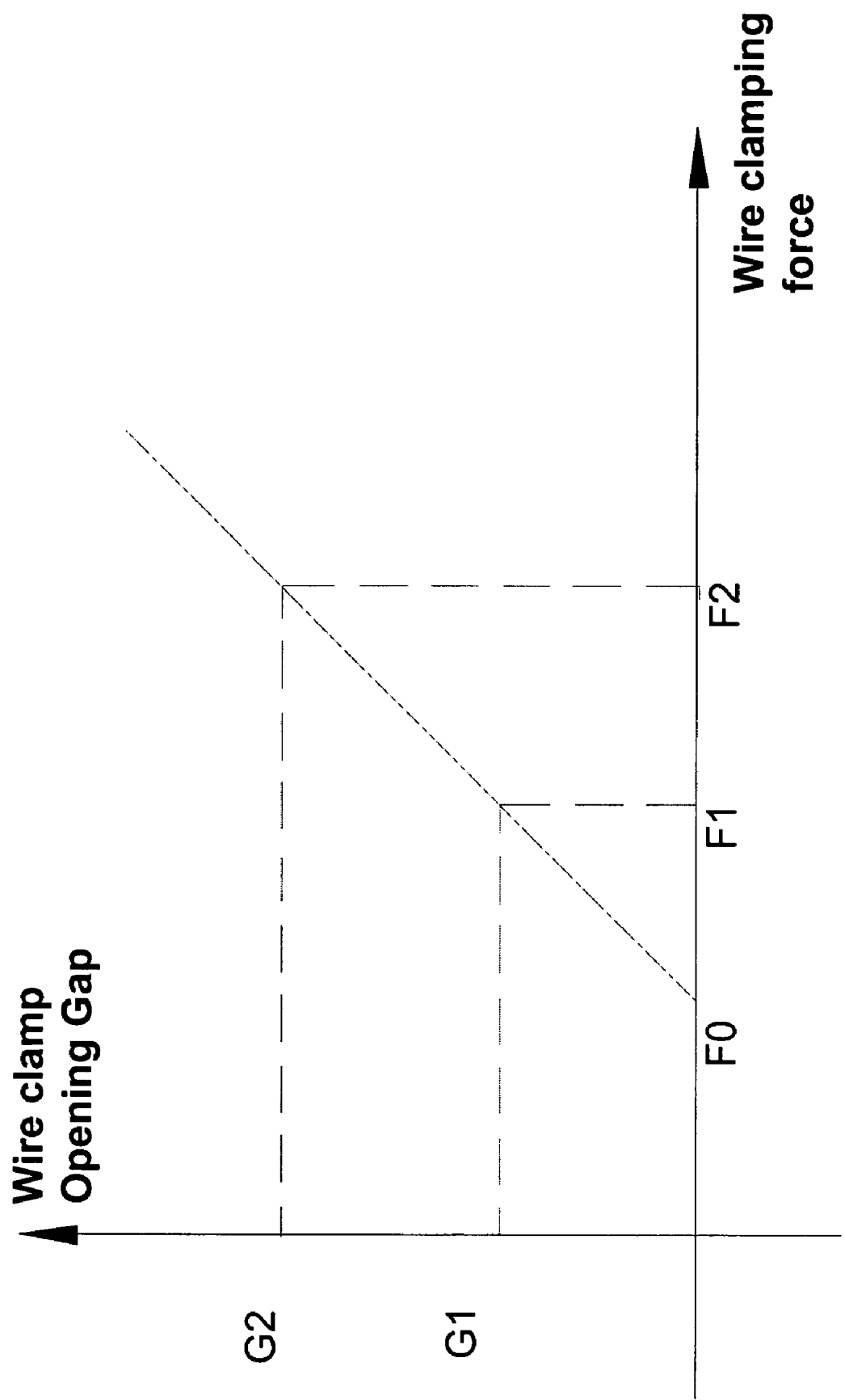
FIG. 7 is a graph illustrating how a wire clamp gap is determinable from a motor force exerted by a wire clamp motor.

FIG. 7 is a graph illustrating how a wire clamp gap 22 is determinable from a motor force 24 exerted by a wire clamp's linear motor 18. For simplicity, the graph is exemplary and presupposes a linear relationship between the spring force 26 and spring flex distance 28. The motor force 24 is controlled by controlling the amount of current flowing through the linear motor 18. Calibration can be performed by controlling the actuating motor force 24 and measuring the clamp gap 22 for different motor forces 24.

At the commencement of calibration, the wire clamp 10 is closed and there is no clamp gap 22. The current in the linear motor 18 is increased until at F0, the motor force 24 is equal to the pre-load elastic spring force 26 exerted by the resilient member on the movable clamping arm 14. The motor force 24 is increased until it reaches F1, whereat a clamp gap 22 of G1 is measured. In essence, since the clamp gap 22 is proportional to the extent the resilient member is flexed, a relationship between the motor force 24 and the extent the resilient member is flexed is being determined. The motor force 24 is further increased to F2, whereat a clamp gap 22 of G2 is measured. From the values of the wire clamping forces F0, F1 and F2, and the corresponding clamp gaps 0, G1 and G2 respectively that are obtained, an elastic force constant, k, of the resilient member is calculated.

After the force constant has been obtained, the clamp gap G can be determined for a given force F exerted by the linear motor 18 by the formula:

$$G=(F-F0)/k, \text{ where } F0 \text{ and } k \text{ have been determined through calibration.}$$

Accordingly, in order to obtain a certain clamp gap G during wire bonding, the apparatus only needs to generate an appropriate motor force F, which can be calculated using the above formula. In other words, a maximum clamp gap during operation of the wire clamp 10 is defined by a predetermined maximum extent to which the resilient is configured to flex, and no more.

It should be appreciated that the wire clamps according to the preferred embodiments of the invention serve to increase the accuracy and reliability in the control of the wire clamp gap during wire bonding. In particular, the clamp gap can be adjusted easily on-the-fly while eliminating human error from manual adjustment. Any gap size within the range of motion of the movable clamping arm 14 can be obtained without having to manually adjust a stopper position each time the clamp gap needs to be changed.

Moreover, complicated tools such as jigs need not be used to manually adjust the clamp gap and this can result in both time and cost savings. Another advantage of not having a fixed stopper position is that there are no abrupt impact forces during opening of the wire clamp that may result in vibration of the wire clamp structure, or unwanted wear and tear that might reduce accuracy provided by the fixed stopper position.

The invention described herein is susceptible to variations, modifications and/or additions other than those specifically described and it is to be understood that the invention includes all such variations, modifications and/or additions which fall within the spirit and scope of the above description.

The invention claimed is:

1. Method for controlling a clamp gap between clamping arms of a wire clamp, comprising the steps of:
   providing a linear motor;
   using the linear motor to generate an actuation force in a first direction for moving the clamping arms relative to each other to open the wire clamp;
   using the linear motor to generate an actuation force in a second direction for moving the clamping arms relative to each other to close the wire clamp;
   positioning a resilient member in contact with the linear motor such that the actuation force generated in the first direction creates a force line which passes through the resilient member and acts directly upon the resilient member to flex the resilient member to an extent that is proportional to the clamp gap; and
   controlling the clamp gap by adjusting a magnitude of the actuation force generated in the first direction according to a predetermined relationship between the actuation forces and the clamp gap.

2. Method as claimed in claim 1, wherein the actuation force generated in the first direction acts on one of the clamping arms, and the resilient member exerts an elastic force on the same clamping arm in an opposite direction to the first direction.

3. Method as claimed in claim 2, wherein a desired wire clamp gap is obtained by balancing the elastic force exerted by the resilient member against the actuation force of the motor generated in the first direction.

4. Method as claimed in claim 1, further comprising a calibration step of determining a relationship between the actuation force generated in the first direction by the motor and the extent the resilient member is flexed by the said actuation force generated in the first direction.

5. Method as claimed in claim 4, wherein the calibration step further comprises the step of determining an elastic force constant of the resilient member.

6. Method as claimed in claim 1, wherein the resilient member comprises a leaf spring.

7. Method as claimed in claim 6, wherein the leaf spring further comprises a pivot.

8. Method as claimed in claim 1, wherein the resilient member comprises a compression spring.

9. Method as claimed in claim 1, wherein the step of adjusting the actuation force generated in the first direction comprises adjusting a magnitude of a current provided to the linear motor.

* * * * *